United States Patent [19]
Kato

[11] Patent Number: 5,742,545
[45] Date of Patent: Apr. 21, 1998

[54] SEMICONDUCTOR MEMORY DEVICE HAVING FUNCTION OF PREVENTING POTENTIAL VARIATION OF READ BUS DUE TO COUPLING

[75] Inventor: Yoshiyuki Kato, Tokyo, Japan

[73] Assignee: NEC Corporation, Tokyo, Japan

[21] Appl. No.: 854,450

[22] Filed: May 14, 1997

[30] Foreign Application Priority Data

May 17, 1996 [JP] Japan .................. 8-148312

[51] Int. Cl.$^6$ ................................. G11C 7/00
[52] U.S. Cl. .............. 365/190; 365/149; 365/202; 365/203
[58] Field of Search .................. 365/190, 203, 365/202, 102, 149

[56] References Cited

U.S. PATENT DOCUMENTS

| | | | |
|---|---|---|---|
| 5,392,249 | 2/1995 | Kan | 365/190 X |
| 5,500,820 | 3/1996 | Nakaoka | 365/190 X |
| 5,504,709 | 4/1996 | Yabe et al. | 365/190 X |
| 5,544,110 | 8/1996 | Yuh | 365/190 X |
| 5,675,530 | 10/1997 | Hirano et al. | 365/190 X |

*Primary Examiner*—Do Hyun Yoo
*Attorney, Agent, or Firm*—Whitham, Curtis, Whitham & McGinn

[57] ABSTRACT

A semiconductor memory device according to the present invention includes a pair of bit lines, a plurality of memory cells connected between the pair of bit lines, a sense amplifier, a pair of read bus lines connected to the sense amplifier, a first and second transistors provided between the pair of read bus line and the pair of bit lines, means for supplying a selection signal to gates of the first and second transistors, and a precharge circuit connected to the pair of read bus lines for precharging and equalizing the pair of read bus lines in response to an inversion of the selection signal, wherein a sum of parasitic capacitances between gates of a plurality of transistors constituting the precharge circuit and the read bus lines is equal to or larger than a sum of parasitic capacitances between gates of the first and second transistors and the read bus lines.

9 Claims, 6 Drawing Sheets

SEMICONDUCTOR MEMORY DEVICE HAVING FUNCTION OF PREVENTING POTENTIAL VARIATION OF READ BUS DUE TO COUPLING

BACKGROUND OF THE INVENTION

1. Field of the Invention

The present invention relates to a semiconductor memory device and, particularly, to a semiconductor memory device having a circuit for preventing a potential on read bus lines from being varied during a digit line selection.

2. Description of the Related Art

A conventional semiconductor memory device will be described with reference to FIG. 1.

In FIG. 1, WL1 to WLn depict word lines and DGT1 and DBG1~DGTm and DBGm depict paired digit lines. Memory cells MC11 to MCnm of an SRAM (Static Random Access Memory) are arranged at cross points of the word lines and the paired digit lines to constitute a memory cell array.

M11 and M12, ... ,Mm1 and Mm2 depict paired N channel transistors having gates connected to each other, respectively, which are adapted to connect a source voltage Vcc to the paired digit lines DGT1 and DGB1, ... , DGTm and DGBm to precharge the paired digit lines. M13 to Mm3 depict N channel transistors having gates connected to the common connections of the paired N channel transistors M11 and M12, ... , Mm1 and Mm2, respectively, which are connected between the paired digit lines and adapted to equalize potential levels thereof.

M14 and M15, ... , Mm4 and Mm5 depict paired N channel transistors, respectively, which are connected between the paired digit lines DGT1 and DGB1, ... , DGTm and DGBm and the read bus lines RBT1 and RBB1 and have gates connected to each other.

A block selection signal BS1 is input to an inverter 1 an output of which is a signal PDG. The signal PDG is supplied to the common connections of the gates of the paired N channel precharge transistors M11 and M12, ... , Mm1 and Mm2 and the equalizing transistors M13 to Mm3.

Further, the block selection signal BS1 is supplied to one input terminals of CMOS logical product circuits AND1 to ANDm having the other input terminals supplied with respective column selection signals Y1D to YmD.

Output signals Yj1 to Yjm of the CMOS logical product circuits AND1 to ANDm are supplied to gate electrodes of digit selection switches (referred to as "YSW", hereinafter) constituted with respective paired N channel transistors M14 and M15, ... , Mm4 and Mm5.

The read buss lines RBT1 and RBB1 are connected to a differential type sense amplifier SA1.

In FIG. 1, a read operation of the SRAM will be described.

When a block is in a non-selection state, the block selection signal BS1 is low level (L) and the precharge N channel transistors M11, M12 and M13, ... , Mm1, Mm2 and Mm3 are in on state. Therefore, the paired digit lines DGT1 and DGB1, ... , DGTm and DGBm are precharged.

When the block selection signal BS1 is selected by a block selection circuit (not shown) and becomes high level (H) to make the block in a selection state, potentials of the memory cells MC11 to MC1m on the word line WL1 selected by a word driver (not shown) are transmitted to the paired digit lines DGT1 and DGB1, ... , DGTm and DGBm connected to the respective memory cells.

Then, when the column selection signal Y1D is selected by a column selection circuit (not shown) and becomes high level (H), the logical product circuit AND1 is selected and the output signal Yj1 thereof becomes high level (H). Since the signal Yj1 is supplied to the gate of the Y switch composed of the N channel transistors M14 and M15, the N channel transistors M14 and M15 are turned on and the potentials of the selected digit lines DGT1 and DGB1 are transmitted to the read bus lines RBT1 and RBB1, respectively.

A minute potential difference ΔV between the read bus lines RBT1 and RBB1 is detected and amplified by the sense amplifier SA1 and a data read is performed.

FIG. 2 shows a conventional circuit around lead bus lines in detail. In FIG. 2, the same components as those shown in FIG. 1 are depicted by the same reference numerals.

Depicting parasitic capacitances between gates of N channel transistors M14 and M15 which constitute a digit line selection switch (YSW) and paired digit lines by C11 and C12, respectively, and those between the gates and read bus lines RBT1 and RBB1 by C13 and C14, respectively, the capacitances C11 and C13 and the capacitances C12 and C14 are in proportion to channel widths W of the N channel transistors M14 and M15, respectively.

It is assumed that the channel lengths of the N channel transistors M14 and M15, which are theoretically L, become L−α and L+α, respectively, according to fabrication conditions and data stored in a memory cell MC11 is "1".

FIG. 3 is a timing chart showing operating waveforms of the circuit shown in FIG. 2.

When the signal PDG is high level (H), the precharge transistors M11 and M12 and the equalizing transistor M13 become on state, so that the potentials of the digit lines DGT1 and DGB1 become Vr which is lower than the source voltage Vcc by a threshold value of the transistors M11 and M12.

Under the circumstance, the state of the signal PDG is changed from H level to L level to release the precharges on the paired digit lines DGT1 and DGB1.

Then, the word line WL1 is changed from L level to H level and the data of the memory cell MC11 is read out on the paired digit lines DGT1 and DGB1. In this case, the potential of the digit line DGB1 is lowered to L level.

The N channel transistors M14 and M15 which constitute the digit line selection switch (YSW) are turned on by changing the state of the selection signal Yj1 from L level to H level, to transmit the data on the digit lines DGT1 and DGB1 to the read bus lines RBT and RBB1.

In this case, there are couplings occurring between the gates of the N channel transistors M14 and M15 and the digit lines and between the gates and the read bus lines due to the parasitic capacitances C11 to C14 of the transistors M14 and M15.

The potentials of the digit lines DGT1 and DGB1 and the read bus lines RBT1 and RBB are raised by the state change of the selection signal Yj1 from L to H level. However, since a parasitic capacitance between the digit lines DGT1 and DGB1 and a ground (GND) is substantially larger than the parasitic capacitances C11 and C12, for example, 48 times, the change of the potential levels of the digit lines DGT1 and DGB1 is very small.

Since, however, parasitic capacitances between the read bus lines RBT1 and RBB1 and the ground GND are not so large as those between the read bus lines RBT1 and RBB and the ground GND, the potential levels of the read bus lines RBT1 and RBB and the ground GND are substantially raised as shown in FIG. 3.

When the N channel transistors M14 and M15 which constitute the digit line selection switch (YSW) are turned on, the potential levels of the digit line DGT1 and the read bus line RBT1 are equalized and the potential levels of the digit line DGB1 and the read bus line RBB1 are equalized.

As mentioned above, when the N channel transistors M14 and M15 which constitute the digit line selection switch (YSW) are imbalanced, the transistor M14 lowers the potential level of the read bus line RBT1 at a higher rate than a lowering rate of the potential level of the read bus line RBB1 by the transistor M14, since the performance (current drive performance which is proportional to channel width (W)/channel length (L)) of the transistor M14 having the channel length of L−α is higher than that of the transistor M15. This operation is reverse to the read out operation of the data "1" stored in the memory cell MC11 and may be a cause of erroneous read out. Further, a time necessary to increase the potential difference between the read bus lines RBT1 and RBB to a value large enough to be amplified by the sense amplifier becomes long. Therefore, there is a problem that the read out time becomes long.

BRIEF SUMMARY OF THE INVENTION

OBJECTS OF THE INVENTION

An object of the present invention is, therefore, to provide a semiconductor memory device capable of preventing a potential variation on read bus lines, which occurs in selecting a digit line, from occurring and of shortening a read out time.

SUMMARY OF THE INVENTION

A semiconductor memory device according to the present invention comprises a plurality of bit line pairs, a plurality of memory cells connected to the plurality of the bit line pairs, a sense amplifier, a read bus line pair connected to the sense amplifier, a first and second transistors provided between each bit line pair and the read bus line pair, respectively, means for supplying a selection signal to gates of the first and second transistor and a precharge circuit connected to the read bus line pair and in response to an inversion of the selection signal to precharge and equalize the read bus line pair, the precharge circuit comprising a plurality of transistors and a sum of parasitic capacitances between gates of the plurality of the transistors and the read bus line pair being equal to or larger than a sum of parasitic capacitances between gates of the first and second transistors and the read bus line pair.

BRIEF DESCRIPTION OF THE DRAWINGS

The above mentioned and other objects, features and advantages of the present invention will become more apparent by reference to the following detailed description of the present invention taken in conjunction with the accompanying drawings, wherein.

DETAILED DESCRIPTION OF THE INVENTION

Figure 1:
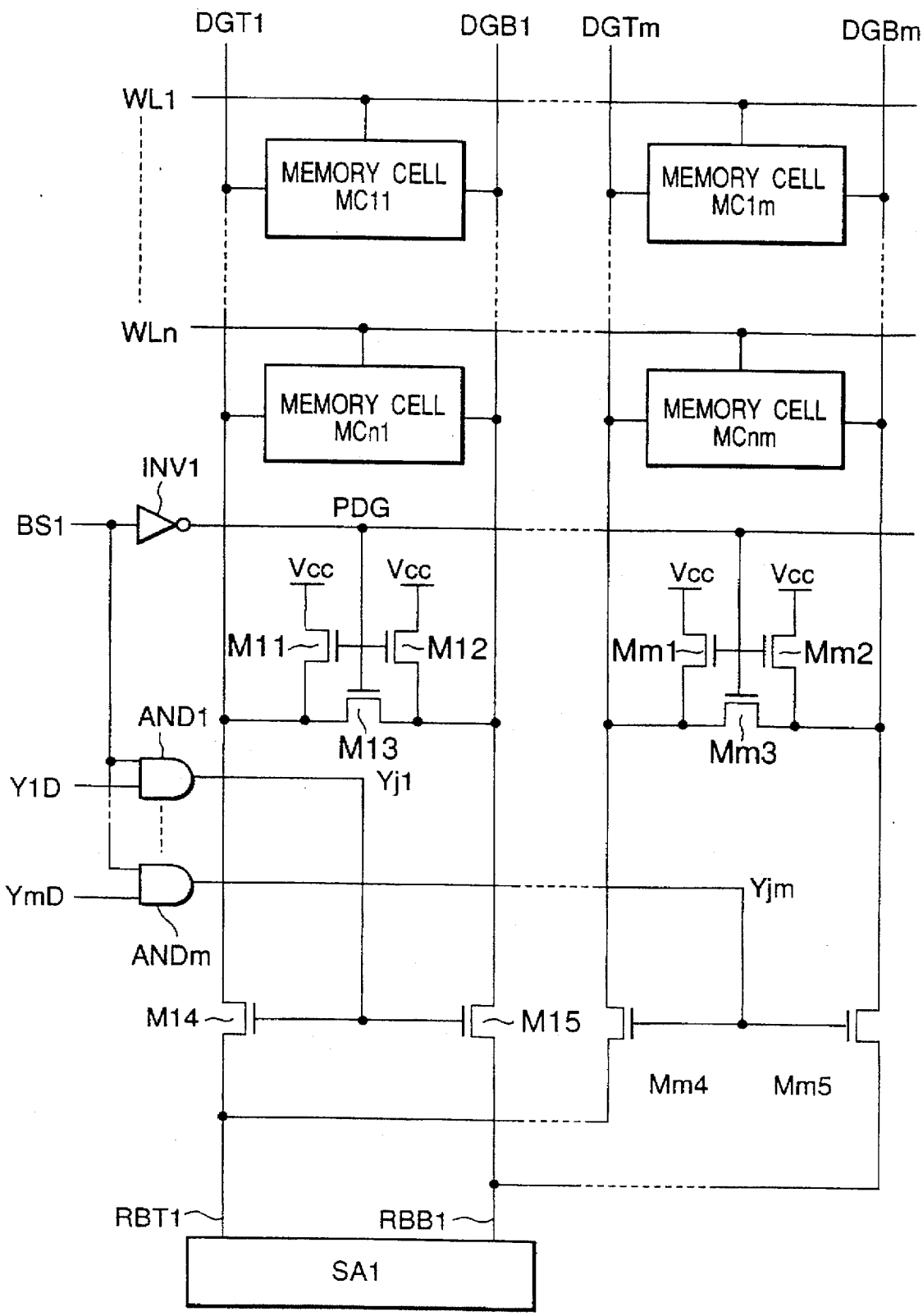
FIG. 1 is a circuit diagram of a conventional semiconductor memory device.
Figure 2:
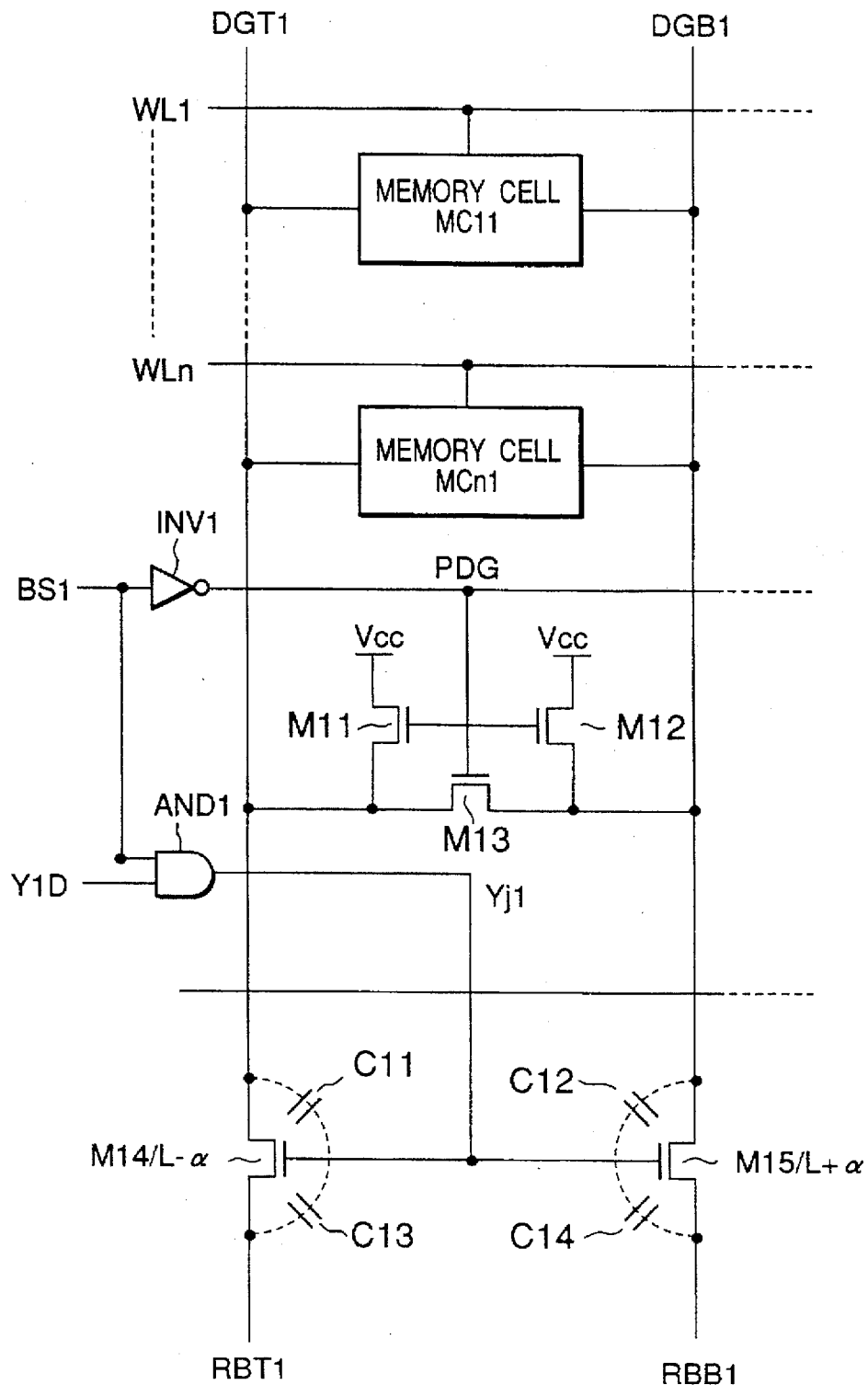
FIG. 2 is a circuit diagram showing a portion of the semiconductor memory device shown in FIG. 1 in detail.

A first embodiment of the present invention will be described with reference to FIG. 4 in which same components as those shown in FIG. 1 are depicted by same reference numerals.

Figure 4:
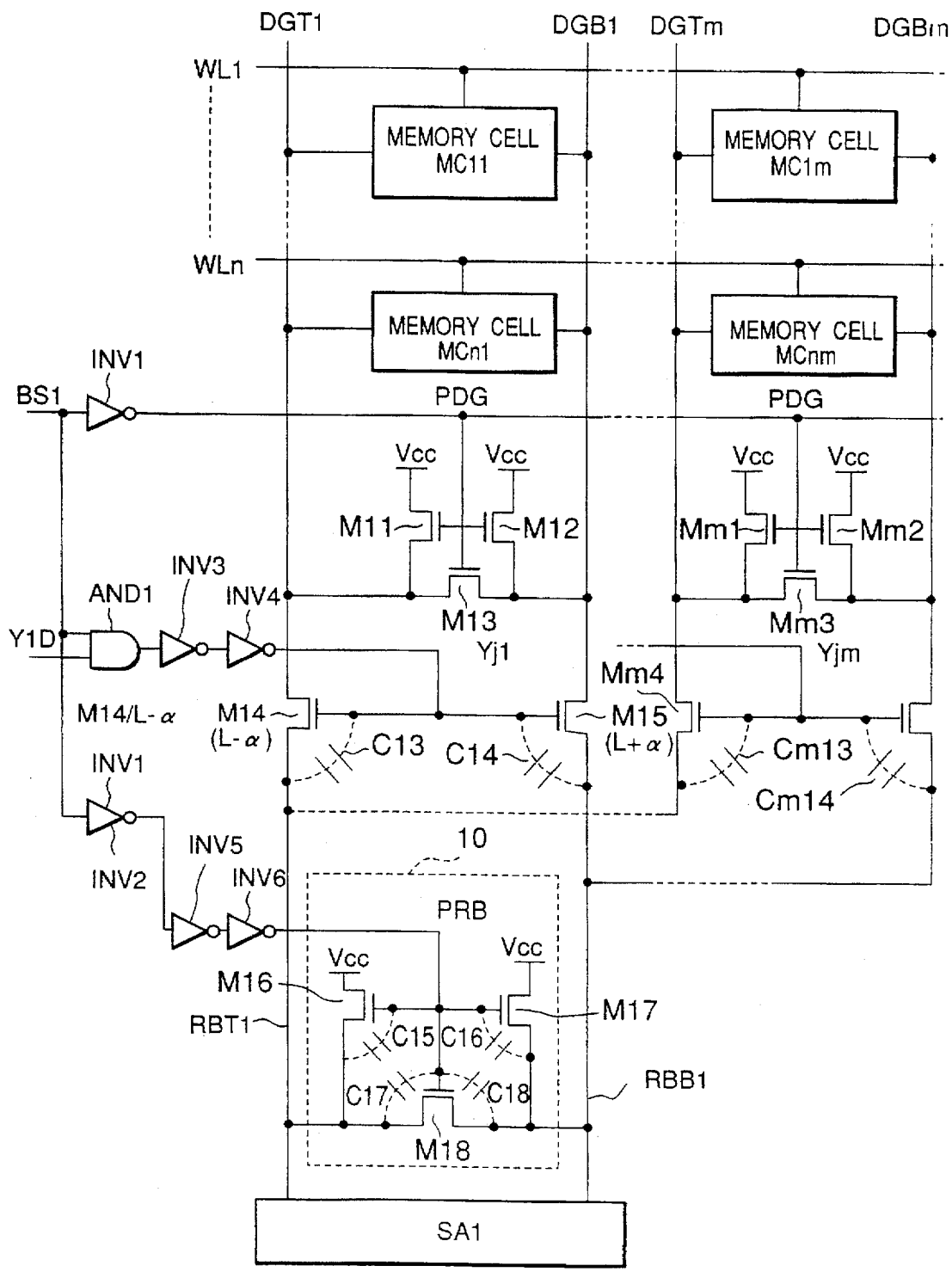
FIG. 4 is a circuit diagram showing a first embodiment of the present invention.

In FIG. 4, WL1 to WLn depict word lines and DGT1 and DGB1, . . . , DGTm and DGBm depict digit line pairs. Memory cells MC11 to MCnm of an SRAM are arranged in cross points of the word lines and the digit lines. N channel transistors M11 and M12 are connected between a source voltage Vcc and the digit line pair DGT1 and DGB1 and adapted to precharge the digit lines. An N channel transistor M13 is connected between paired digit lines DGT1 and DGB1 and adapted to equalize potential levels of these digit lines. Other digit line pairs have the same construction.

N channel transistors M14 and M15, . . . , Mm4 and Mm5 are connected between the paired digit lines DGT1 and DGB1, . . . , DGTm and DGBm and read bus lines RBT1 and RBB1, respectively. A block selection signal BS1 is input to a gate of an inverter INV1 and a signal PDG output from the inverter INV1 is supplied to gates of the paired N channel precharge transistors M11 and M12 and the N channel equalizing transistor M13.

Further, the block selection signal BS1 is supplied to one input terminal of a CMOS logical product circuit AND1 having the other input terminal supplied with a column selection signal Y1D. An output signal of the CMOS logical product circuit AND1 is delayed by a predetermined time by inverters INV3 and INV4 and becomes a signal Yj1 which is input to gates of the N channel transistors M14 and M15 which constitute the digit line selection switch (YSW).

N channel transistors M16 and M17 are connected between the source voltage Vcc and the read bus lines RBT1 and RBB1 and adapted to precharge the read bus. An N channel transistor M18 is connected between the read bus lines RBT1 and RBB1 and adapted to equalize potentials of the read bus lines RBT1 and RBB1. The transistors M16, M17 and M18 constitute a potential variation preventing circuit 10.

The block selection signal BS1 is input to an inverter INV2 and an output of the inverter INV2 is passed through inverters INV5 and INV6, resulting in a signal PRB which is input to gates of the N channel transistors M16, M17 and M18.

Parasitic capacitances between the gates of the N channel transistors M16 and M17 and the read bus lines RBT1 and RBB1 are depicted by C15 and C16, respectively, a parasitic capacitance between the gate of the N channel transistor M18 and the read bus line RBT1 is depicted by C17 and a parasitic capacitance between the gate of the N channel transistor M18 and the read bus line RBB1 is depicted by C18.

The parasitic capacitances of the N channel transistors M16, M17 and M18 are determined such that the following equation (1) is satisfied:

$$C13+C14=C15+C16+C17+C18 \tag{1}$$

where C13 and C14 are parasitic capacitances between the gates of the N channel transistors M14 and M15 and the read bus lines RBT1 and RBB1, respectively.

The simplest way for controlling a parasitic capacitance of a transistor is to control the channel length (L) or the channel width (W) thereof. Since it is preferable in view of the fabrication of transistor to make the channel length constant, the parasitic capacitances of the transistors are preferably controlled by changing the value of W thereof.

In this embodiment, the equation (1) can be satisfied by selecting the values of W according to the following equation (sum of W's of the transistors M14 and M15)=(sum of W's of the transistors M16 to M18).

The equation (1) can be represented by $$C13=C15+C17$$

$$C14=C16+C18$$

Therefore, the following equations are established:

(W of the transistor M14)=(sum of W's of the transistors M16 and M18)

(W of the transistor M15)=(sum of W's of the transistors M17 and M18)

When the signal PDG is high level, the precharge transistors M11 and M12 and the equalizing transistor M13 become on state, so that the potentials of the digit lines DGT1 and DGB1 become Vr which is lower than the source voltage Vcc by a threshold value of the transistors M11 and M12. Since, in this case, the control signal PRB for precharging and equalizing the read bus lines is also in high level, the precharging transistors M16 and M17 for precharging the read bus lines RBT1 and RBB1 and the equalizing transistor M18 are turned on and the potentials of the read bus lines RBT1 and RBB1 become Vr which is lower than the source voltage Vcc by a voltage corresponding to the threshold value of the transistor M16 or M17.

Under the circumstance, when the block selection signal BS1 is changed from low level to high level, the state of the signal PDG is changed from H level to L level and the N channel transistors M11 and M12 are turned off to release the precharges on the paired digit lines DGT1 and DGB1.

Then, the word line WL1 is changed from L level to H level and the data of the memory cell MC11 is read out on the paired digit lines DGT1 and DGB1. In this case, the potential of the digit line DGB is lowered to L level. Further, the column selection line Y1D becomes high level by the column selection circuit which is not shown.

When the potential difference between the digit lines DGT1 and DGB1 is increased to a value large enough to be amplified by a sense amplifier, the signal PRB is changed in level from high to low to release the precharge of the read bus lines RBT1 and RBB1. Simultaneously, since the N channel transistors M14 and M15 which constitute the digit line selection switch (YSW) are turned on, the selection signal Yj1 is changed in level from low to high.

In this case, there are couplings occurring between the gates of the N channel transistors M14 and M15 and the digit lines and between the gates and the read bus lines due to the parasitic capacitances C13 and C14 of the transistors M14 and M15 and the potential levels of the read bus lines RBT1 and RBB1 tend to be increased.

Since, however, the signal PRB is changed in level from high to low, simultaneously with the level change of the selection signal Yj1 from low to high, there are couplings between the gates of the N channel transistors M16, M17 and M18 and the read bus lines due to the parasitic capacitances C15 to C18, with which the levels of the read bus lines tend to be reduced.

Since, in this embodiment, the parasitic capacitances of the transistors, which cause the coupling of the read bus lines are made equal as represented by the equation (1), noises caused by the opposite couplings are substantially cancelled out and there is no substantial variation of potential of the read bus lines.

Therefore, there is no occurrence of erroneous data read even when the channel lengths of the N channel transistors M14 and M15 which constitute the digit line selection switch YSW are varied as shown in FIG. 4.

Now, a second embodiment of the present invention will be described. The second embodiment differs from the first embodiment shown in FIG. 1 in that the parasitic capacitances C15 and C16 between the gates of the N channel transistors M16 and M17 and the read bus lines RBT1 and RBB1, the parasitic capacitance C17 between the gate of the N channel transistor M18 and the read bus line RBT1 and the parasitic capacitance C18 between the gate of the transistor M18 and the read bus line RBB1 satisfy the following equation (2):

$$C13+C14 \leq C15+C16+C17+C18 \tag{2}$$

where C13 and C14 are parasitic capacitances between the gates of the N channel transistors M14 and M15 and the read bus lines RBT1 and RBB1, respectively.

With such selection of the parasitic capacitances of the N channel transistors as represented by the equation (2), it is possible to give a potential variation which is larger than the potential variation of the read bus lines caused by the coupling of the selection signal of the digit line selection switch (YSW) to the same read bus lines to thereby lower the potential of the read bus lines than the potential of the digit line.

Figure 5:
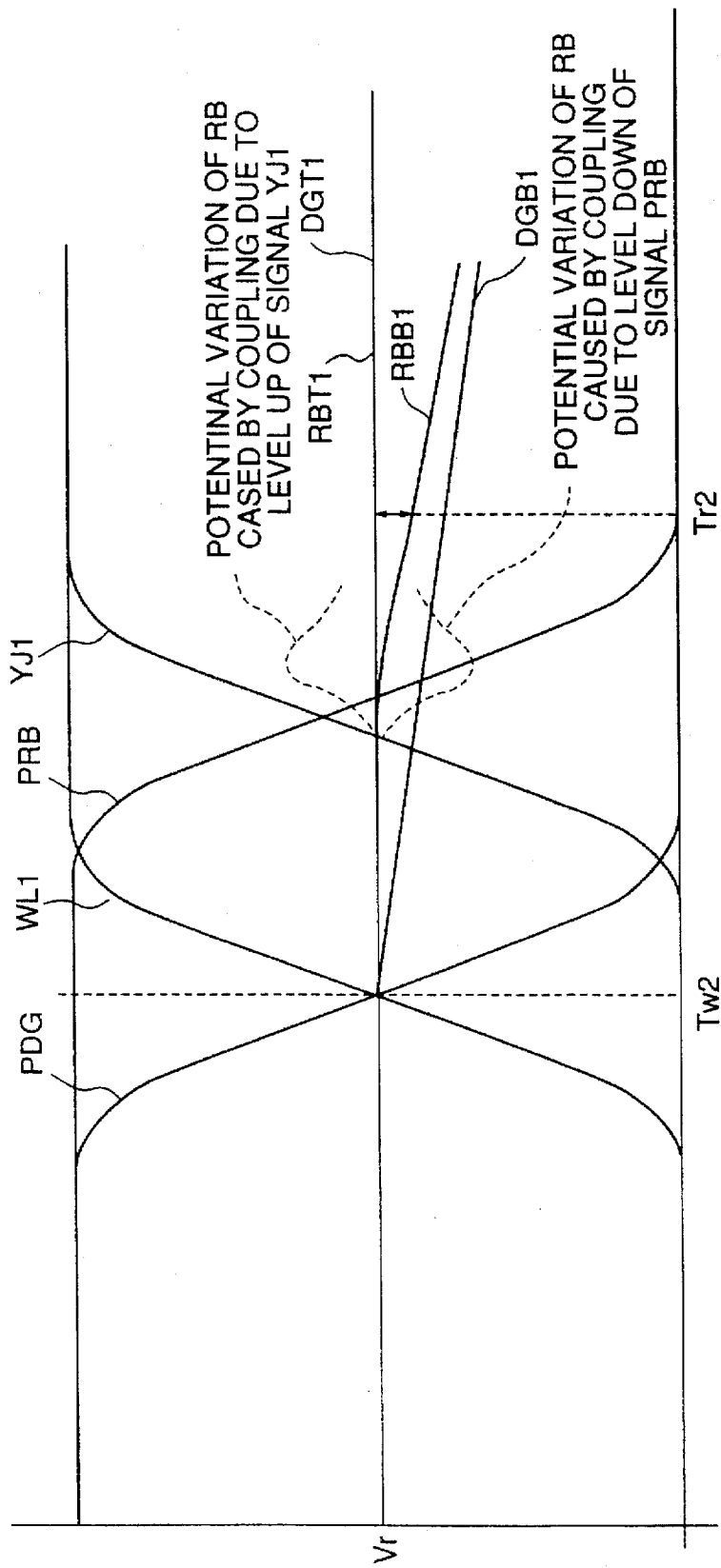
FIG. 5 shows waveforms showing an operation of the circuit shown in FIG. 4.
Figure 6:
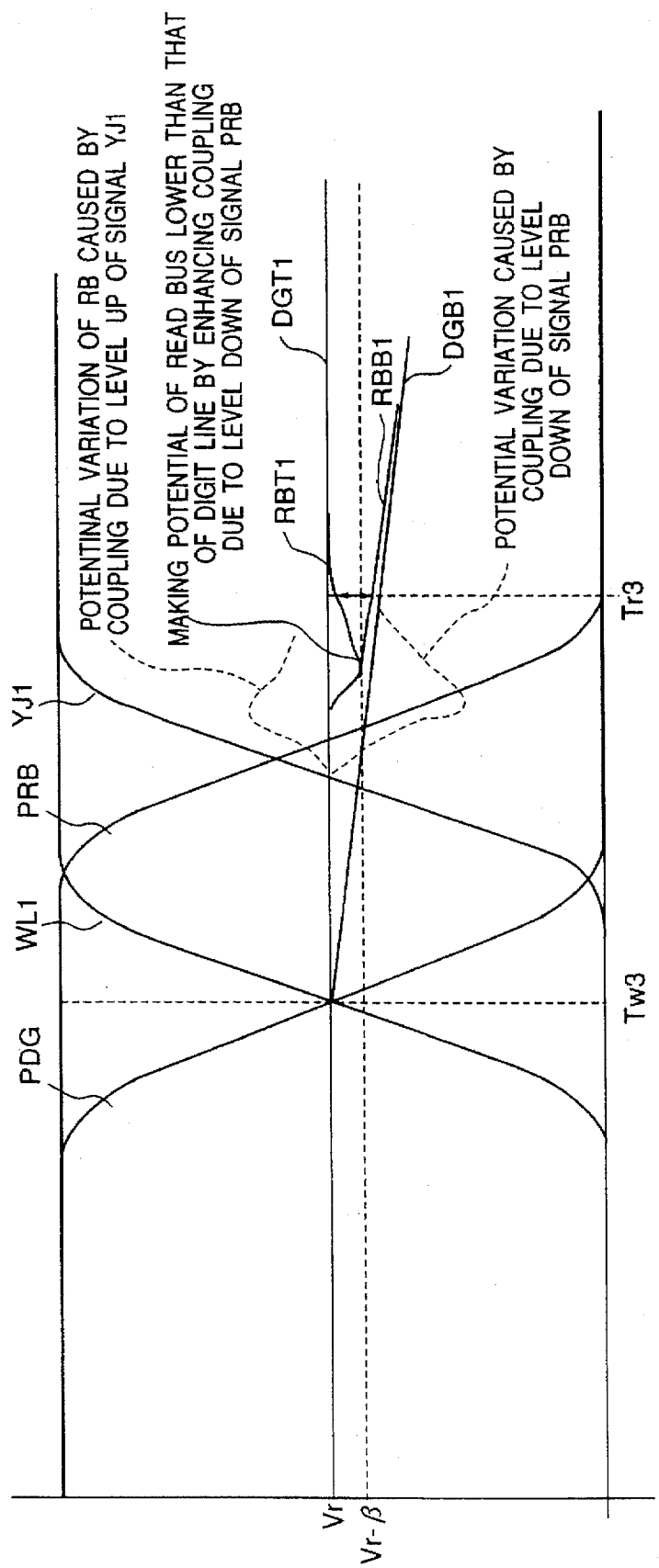
FIG. 6 shows waveforms showing an operation of a second embodiment of the present invention.

FIG. 6 shows a timing chart of an operation of the second embodiment. The timing chart except a portion thereof which is shown in FIG. 5 will be described.

When the state of the signal Yj1 is changed from low level to high level, there are signal couplings occur between the gates of the N channel transistors M14 and M15 and the read bus lines due to the parasitic capacitances C13 and C14. However, when the state of the signal PRB is changed from high level to low level, signal couplings occur again between the gates of the precharge transistors M16 and M17 and the equalizing transistor M18 and the read bus lines due to the parasitic capacitances C15 to C18 of these transistors, causing the levels of the read bus lines RBT1 and RBB1 to be lowered.

Since, in the second embodiment, the sum of the parasitic capacitances of the transistors M16 to M18 which cause the signal couplings which lower the potentials of the read bus lines are selected as larger than those of the transistors M14 and M15, the potentials of the read bus lines become (Vr−β) which is lower than the potential of the digit line.

Since the potential difference between the substrate and the source of the N channel transistors M14 and M15 is larger and the current drive performance becomes lower when the following equations (3) in which the potentials of the digit line and the read bus line corresponding to the digit line are the same established than that when the following equations (4) in which the potential of the digit line is higher than that of the read bus line corresponding to the digit line by β, the potential difference between the read bus lines which is input to the sense amplifier becomes large at a higher rate than in the first embodiment:

$$DGT1-RBT1=0, \ DGB1-RBB1=0 \tag{3}$$

$$DGT1-RBT1=\beta, \ DGB1-RBB1=\beta \tag{4}$$

However, since erroneous data read may occur when the coupling which causes the potential of the read bus line to be lowered is too much as in the conventional technique, the reduction of the potential of the read bus line is limited.

Therefore, a higher speed operation than that obtainable by the first embodiment becomes possible when the increase of the operation speed due to increased current drive performance of the N channel transistor is larger than the delay of operation which is caused by the potential variation due to the coupling, as shown in FIG. 6. That is, in FIG. 6, the time instance Tr3 at which the potential difference between the read bus lines RBT1 and RBB1 becomes a value which is large enough to be amplified by the differential type sense amplifier is earlier than the time instance Tr2 shown in FIG. 5, as will be described later.

The merits of the higher speed operation and the merits in fabrication which are realized by the first embodiment of the present invention will be described with reference to FIG. 3 which shows the timing chart of operation of the conventional device and FIG. 5 which shows the timing chart of the first embodiment.

In FIG. 5, Tw2 is a time instance at which the word line WL1 is activated and Tr2 is the time instance at which the potential difference between the read bus lines RBT1 and RBB1 becomes a value large enough to be amplified by the differential sense amplifier. Similarly, in FIG. 3, Tw5 is a time instance at which the word line is activated and Tr5 is the time instance at which the potential difference between the read bus lines RBT1 and RBB1 becomes a value large enough to be amplified by the differential sense amplifier.

Since the operations of the conventional device and the first embodiment of the present invention up to the word line selection are performed by the same circuit constructions, the following equation (5) is established:

$$Tw2=Tw6 \tag{5}$$

Further, assuming that the potential difference between the read bus lines RBT1 and RBB1 which is large enough to be amplified by the differential type sense amplifier is 50 mV, the equation (5) can be modified to the following equation (6) in the case shown in FIG. 5.

$$RBT1-RBB1=0 \rightarrow 50 \text{ mV} \tag{6}$$

Figure 3:
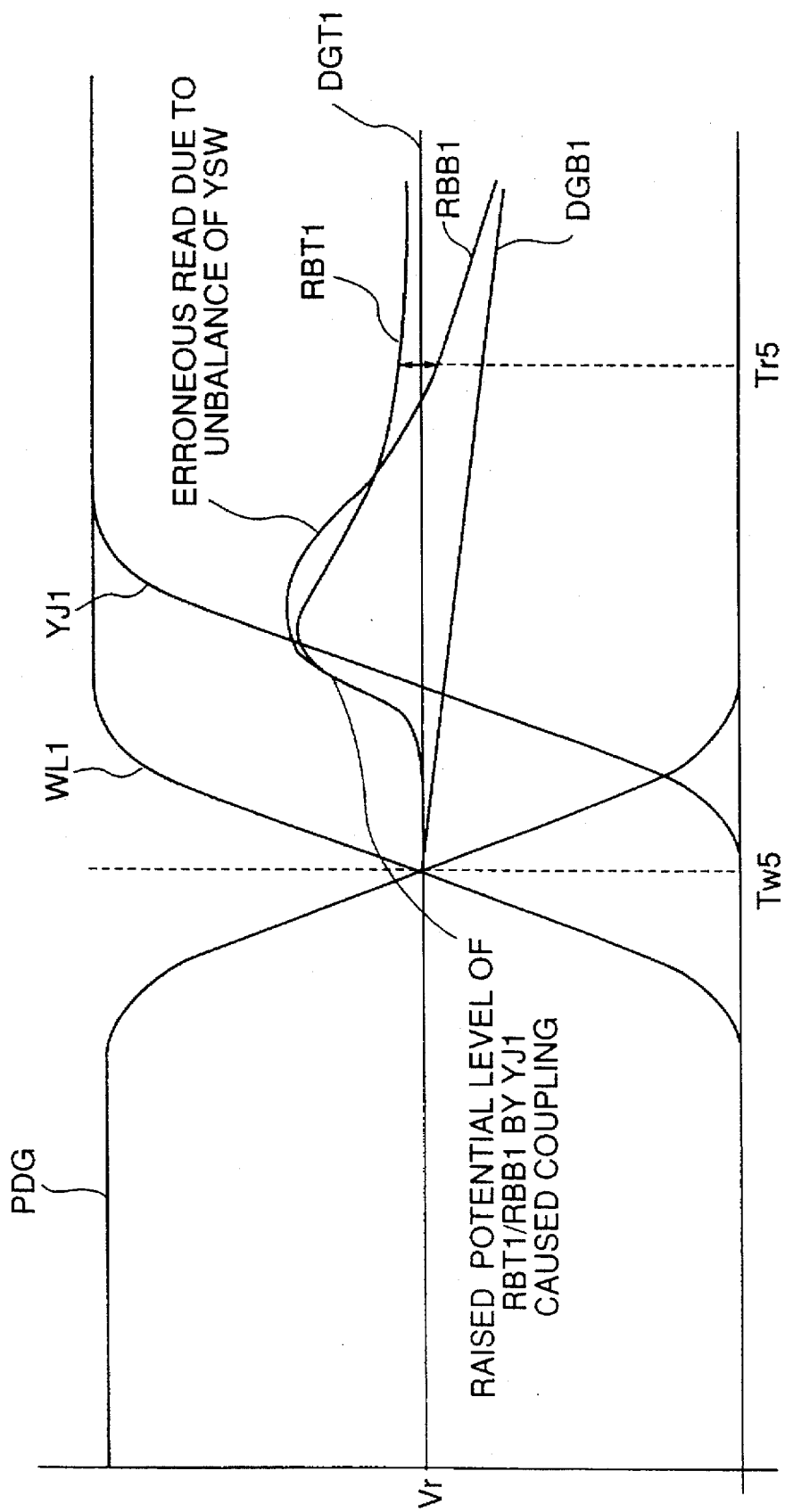
FIG. 3 shows waveforms showing an operation of the circuit shown in FIG. 2.

On the contrary, the equation (5) is modified to the following equation (7) in the case shown in FIG. 3.

$$RBT1-RBB1=0 \rightarrow -15 \text{ mV} \rightarrow 0 \rightarrow 50 \text{ mV} \tag{7}$$

Therefore, the following equation (8) is obtained:

$$Tr2 \leq Tr6 \tag{8}$$

From the equations (5) and (8), a difference between a time instance at which the potential of the word line is increased and a time instance at which the potential difference of the read bus lines becomes large enough to be amplified by the differential type sense amplifier can be represented in both the conventional device and the first embodiment, by the following equation (9):

$$\Delta Tr=Tr2-Tr5 \tag{9}$$

The time difference ΔTr was calculated by a synchronous SRAM of 1M bits, resulting in the following equation (10):

$$\Delta Tr=1.0 \text{ ns} \tag{10}$$

From the equation (10), it is clear that the merits are obtained that, when the present invention is used to perform an asynchronous type operation, the access time is shortened by 1.0 ns and, when it is used to perform a synchronous type operation, the cycle time is shortened by 1.0 ns.

Although the parasitic capacitances are controlled by the channel width W of the transistors in the described embodiments, it is possible to control of the parasitic capacitances by the channel length L of the transistors.

Although the present invention has been described with reference to specific embodiments, this description is not meant to be construed in a limiting sense, various modifications of the disclosed embodiments will become apparent to persons skilled in the art upon reference to the description of the present invention. It is, therefore, contemplated that the appended claims will cover any modifications or embodiments as fall within the true scope of the present invention.

What is claimed is:

1. A semiconductor memory device comprising first and second bit lines, a plurality of memory cells connected between said first and second bit lines, a sense amplifier, a first and second read bus lines connected to said sense amplifier, a first transistor provided between said first read bus line and said first bit line, a second transistor provided between said second read bus line and said second bit line, means for supplying a selection signal to gates of said first and second transistors, first capacitance means having one end connected to said first read bus line and having a capacitance equal to a parasitic capacitance between said gate of said first transistor and said first read bus line, second capacitance means having one end connected to said second read bus line and having a capacitance equal to a parasitic capacitance between said gate of said second transistor and said second read bus line, and means for supplying an inversion of the selection signal to the other ends of said first and second capacitance means.

2. A semiconductor memory device as claimed in claim 1, wherein said first capacitance means includes a third transistor provided between a power source terminal and said first read bus line and having a gate supplied with the inversion of the selection signal and a fourth transistor provided between said first read bus line and said second read bus line and having a gate supplied with the inversion of the selection signal, and said second capacitance means includes a fifth transistor provided between said power source terminal and said second read bus line and having a gate supplied with the inversion of the selection signal.

3. A semiconductor memory device as claimed in claim 2, wherein a sum of a channel width of said third transistor and a channel width of said fourth transistor is substantially equal to a channel width of said first transistor and a sum of a channel width of said fifth transistor and the channel width of said fourth transistor is substantially equal to a channel width of said second transistor.

4. A semiconductor memory device comprising a pair of bit lines, a plurality of memory cells connected between said pair of bit lines, a sense amplifier, a pair of read bus lines connected to said sense amplifier, first and second transistors provided between said pair of read bus line and said pair of bit lines, means for supplying a selection signal to gates of said first and second transistors, and voltage supplying means connected to said pair of read bus lines and having a capacitance value equal to or larger than a sum of parasitic capacitances between the gates of said first and second transistors and said read bus lines for transmitting a voltage change produced in responsive to an inversion of the selection signal to said pair of read bus lines.

5. A semiconductor memory device as claimed in claim 4, wherein said voltage supplying means includes a third transistor provided between a power source terminal and one of said pair of read bus lines and having a gate supplied with the inversion of the selection signal and a fourth transistor provided between said pair of read bus lines and having a gate supplied with the inversion of the selection signal, and a fifth transistor provided between said power source terminal and the other of said pair of read bus lines and having a gate supplied with the inversion of the selection signal.

6. A semiconductor memory device as claimed in claim 5, wherein a sum of a channel width of said third transistor and a channel width of said fourth transistor is substantially equal to or larger than a channel width of said first transistor and a sum of a channel width of said fifth transistor and the channel width of said fourth transistor is substantially equal to or larger than a channel width of said second transistor.

7. A semiconductor memory device comprising a pair of bit lines, a plurality of memory cells connected between said pair of bit lines, a sense amplifier, a pair of read bus lines connected to said sense amplifier, first and second transistors provided between said pair of read bus line and said pair of bit lines, means for supplying a selection signal to gates of said first and second transistors, and a precharge circuit including a plurality of transistors, connected to said pair of read bus lines and responsive to an inversion of the selection signal to precharge and equalize said pair of read bus lines, wherein a sum of parasitic capacitances between gates of said plurality of transistors and said read bus lines is substantially equal to or larger than a sum of parasitic capacitances between said gates of said first and second transistors and said read bus lines.

8. A semiconductor memory device as claimed in claim 7, wherein said plurality of transistors constituting said precharge circuit include a third transistor provided between a power source terminal and one of said pair of read bus lines and having a gate supplied with the inversion of the selection signal and a fourth transistor provided between said pair of read bus lines and having a gate supplied with the inversion of the selection signal, and a fifth transistor provided between said power source terminal and the other of said pair of read bus lines and having a gate supplied with the inversion of the selection signal.

9. A semiconductor memory device as claimed in claim 8, wherein a sum of a channel width of said third transistor and a channel width of said fourth transistor is substantially equal to or larger than a channel width of said first transistor and a sum of a channel width of said fifth transistor and the channel width of said fourth transistor is substantially equal to or larger than a channel width of said second transistor.

* * * * *